United States Patent
Xu et al.

(10) Patent No.: US 9,502,444 B2
(45) Date of Patent: Nov. 22, 2016

(54) METHOD FOR FORMING A THIN-FILM LAYER PATTERN, DISPLAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Liyan Xu, Beijing (CN); Ming Tian, Beijing (CN); Junwei Wang, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/429,640

(22) PCT Filed: Jun. 27, 2014

(86) PCT No.: PCT/CN2014/080903
§ 371 (c)(1),
(2) Date: Mar. 19, 2015

(87) PCT Pub. No.: WO2015/106545
PCT Pub. Date: Jul. 23, 2015

(65) Prior Publication Data
US 2016/0020231 A1    Jan. 21, 2016

(30) Foreign Application Priority Data
Jan. 14, 2014 (CN) .......................... 2014 1 0015561

(51) Int. Cl.
*H01L 21/027* (2006.01)
*H01L 21/314* (2006.01)
(Continued)

(52) U.S. Cl.
CPC ......... *H01L 27/1262* (2013.01); *G02F 1/1333* (2013.01); *G03F 7/00* (2013.01); *H01L 21/77* (2013.01); *H01L 27/1248* (2013.01); *G02F 1/1368* (2013.01); *H01L 2021/775* (2013.01)

(58) Field of Classification Search
CPC   H01L 21/3213; H01L 27/1288; G03F 7/202
See application file for complete search history.

(56) References Cited

U.S. PATENT DOCUMENTS 7,767,595 B2   8/2010   Tanaka et al.
8,546,067 B2   10/2013  Jain et al.
(Continued)

FOREIGN PATENT DOCUMENTS

CN   101170058 A   4/2008
CN   101957560 A   1/2011
(Continued)

OTHER PUBLICATIONS

Oct. 27, 2014—(WO) International Search Report—App PCT/CN2014/080903.
(Continued)

*Primary Examiner* — Raj R Gupta
(74) *Attorney, Agent, or Firm* — Banner & Witcoff, Ltd.

(57) ABSTRACT

A method for forming a thin-film layer pattern, a display substrate and a manufacturing method thereof, and a display device are provided. The method for forming the thin-film layer pattern comprises: forming a first thin-film layer to be patterned on a substrate; forming a first overcoat (OC) layer on a surface of the first thin-film layer; forming a first overcoat layer pattern by beam melting; and removing the first thin-film layer not covered by the first overcoat layer pattern to form a first thin-film layer pattern. The method adopts beam melting process and hence can improve the accuracy and the resolution of the display substrate, improve the product quality and reduce the manufacturing cost.

11 Claims, 7 Drawing Sheets

(51) Int. Cl.
*H01L 27/12* (2006.01)
*G02F 1/1333* (2006.01)
*G03F 7/00* (2006.01)
*H01L 21/77* (2006.01)
*G02F 1/1368* (2006.01)

(56) References Cited

U.S. PATENT DOCUMENTS

| | | | |
|---|---|---|---|
| 2002/0008529 A1* | 1/2002 | Wilson | G01R 1/07314 324/756.03 |
| 2008/0108229 A1* | 5/2008 | Tanaka | B23K 26/0613 438/795 |
| 2015/0173202 A1* | 6/2015 | Anosov | H05K 3/065 29/847 |

FOREIGN PATENT DOCUMENTS

| | | |
|---|---|---|
| CN | 103760749 A | 4/2014 |
| JP | 1018059 A | 1/1998 |
| JP | 1020509 A | 1/1998 |
| JP | 200873768 A | 4/2008 |
| JP | 2008242175 A | 10/2008 |

OTHER PUBLICATIONS

Mar. 31, 2016—(CN)—First Office Action Application 201410015561.9 with English Tran.

\* cited by examiner

METHOD FOR FORMING A THIN-FILM LAYER PATTERN, DISPLAY SUBSTRATE AND MANUFACTURING METHOD THEREOF, AND DISPLAY DEVICE

The application is a U.S. National Phase Entry of International Application No. PCT/CN2014/080903 filed on Jun. 27, 2014, designating the United States of America and claiming priority to Chinese Patent Application No. 201410015561.9 filed on Jan. 14, 2014. The present application claims priority to and the benefit of the above-identified applications and the above-identified applications are incorporated by reference herein in their entirety.

TECHNICAL FIELD

Embodiments of the present invention relate to a method for forming a thin-film layer pattern, a display substrate and a manufacturing method thereof, and a display device.

BACKGROUND

Liquid crystal displays (LCDs), as a kind of flat-panel display devices, are more and more widely applied in the high-performance display field due to the characteristics of small volume, low power consumption, non-radiation, low manufacturing cost and the like.

A LCD comprises an array substrate and a color filter (CF) substrate subjected to cell-assembly. The array substrate or the CF substrate is generally formed by forming film layers on a transparent substrate by mask exposure processes. Liquid crystals are filled between the array substrate and the CF substrate. The light intensity is controlled through the control of the deflection of the liquid crystals. Moreover, color images are displayed by the filtering function of the CF substrate.

SUMMARY

The method for forming the thin-film layer pattern, the display substrate and the manufacturing method thereof, and the display device provided by at least one embodiment of the present invention adopt beam melting for patterning and hence can improve the accuracy and the resolution of the display substrate, improve product quality and reduce manufacturing cost.

In one aspect, an embodiment of the present invention provides a method for forming a thin-film layer pattern, which comprises: forming a first thin-film layer to be patterned on a substrate; forming a first overcoat (OC) layer on a surface of the first thin-film layer; forming a first overcoat layer pattern by beam melting; and removing the first thin-film layer not covered by the first overcoat layer pattern to form a first thin-film layer pattern.

In another aspect, an embodiment of the present invention provides a method for manufacturing a display substrate, which comprises: forming a first thin-film layer to be patterned on a substrate; forming a first overcoat layer on a surface of the first thin-film layer; forming a first overcoat layer pattern by beam melting; and removing the first thin-film layer not covered by the first overcoat layer pattern to form a first thin-film layer pattern.

In still another aspect, an embodiment of the present invention provides a display substrate, which comprises: a first thin-film layer to be patterned formed on a substrate; a first overcoat layer formed on a surface of the first thin-film layer; and a first overcoat layer pattern formed by beam melting, in which the accuracy of the first overcoat layer pattern is in nanometer.

In still another aspect, the embodiment of the present invention provides a display substrate, which comprises a plurality of thin-film layer patterns. At least one thin-film layer pattern in the plurality of thin-film layer patterns is formed by beam melting or the accuracy is in nanometer.

In still another aspect, the embodiment of the present invention provides a display device, which comprises the foregoing display substrate.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
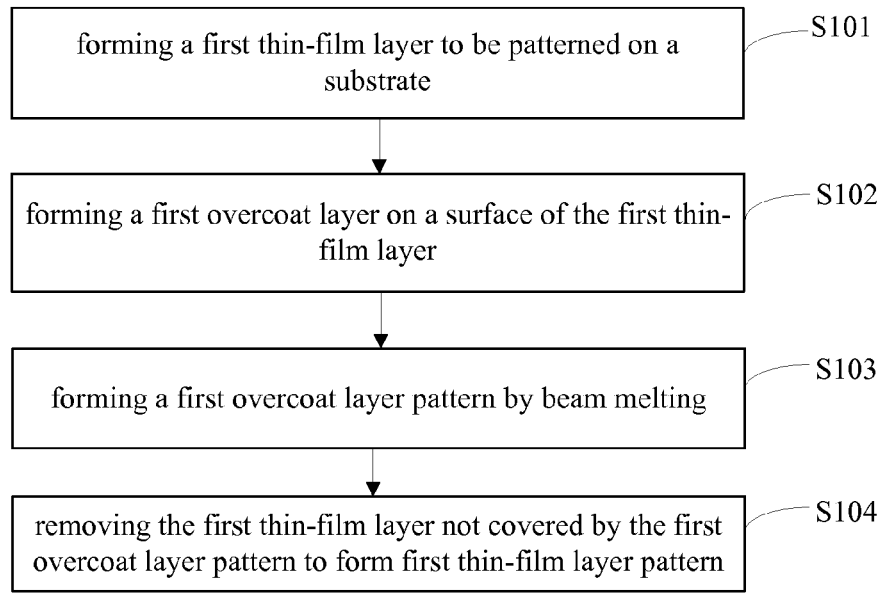
FIG. 1 is a flowchart of a method for forming a thin-film layer pattern provided by an embodiment of the present invention.

At least one embodiment of the present invention provides a method for forming a thin-film layer pattern, which, as illustrated in FIG. 1, comprises the following steps.

Figure 2:
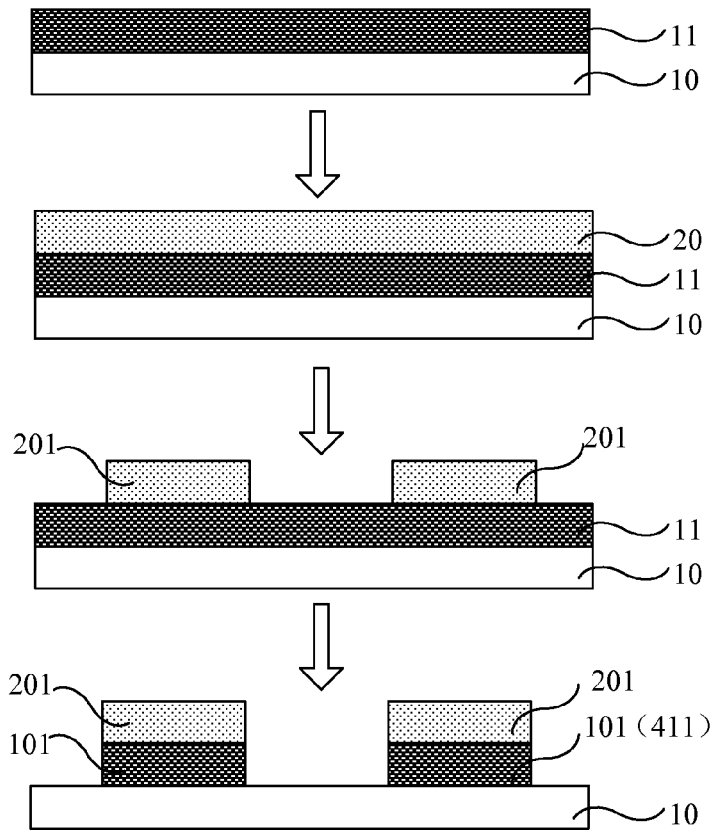
FIG. 2 is a schematic structural view illustrating one process for forming the thin-film layer patterns provided by the embodiment of the present invention.

S101: as illustrated in FIG. 2, forming a first thin-film layer 11 to be patterned on a substrate 10. For instance, the first thin-film layer 11 to be patterned may be formed on the substrate 10 by deposition, sputtering, coating, printing or the like.

S102: forming a first overcoat layer 20 on a surface of the first thin-film layer 11.

S103: forming a first overcoat layer pattern 201 by beam melting.

S104: removing the first thin-film layer 11 not covered by the first overcoat layer pattern 201 to form a first thin-film layer pattern 101.

One embodiment of the present invention provides a method for forming a thin-film layer pattern, which comprises: forming a first thin-film layer to be patterned on a substrate; forming a first overcoat layer on a surface of the first thin-film layer; forming a first overcoat layer pattern by beam melting; and removing the first thin-film layer not covered by the first overcoat layer pattern to form a first thin-film layer pattern. Thus, during the manufacturing and processing of the display substrate, high-accuracy beams may be utilized to replace a mask plate in use. Therefore, the accuracy and the resolution of the display substrate can be improved; the product quality can be improved; and the manufacturing cost can be reduced. Herein, the beam melting method includes laser ablation or similar method.

In at least one embodiment of the present invention, after the step S104, the method may further comprise: removing the first overcoat layer pattern 201. Thus, the substrate provided with the first thin-film layer pattern 101 can be manufactured by removing unwanted thin-film layer, e.g., the first overcoat layer pattern 201.

Figure 3:
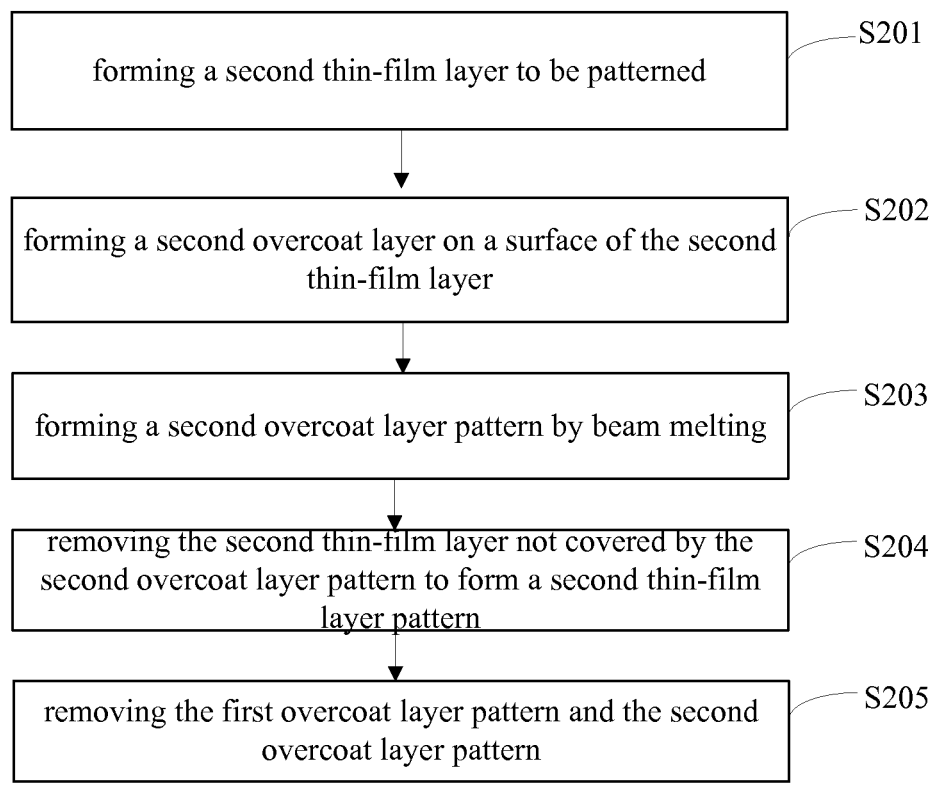
FIG. 3 is a flowchart of a method for forming a thin-film layer pattern provided by an embodiment of the present invention.

In at least one embodiment of the present invention, when a plurality of patterns of thin-film layers are formed on the substrate 10, after the step S104, as illustrated in FIG. 3, the method may further comprise the following processes.

Figure 4:
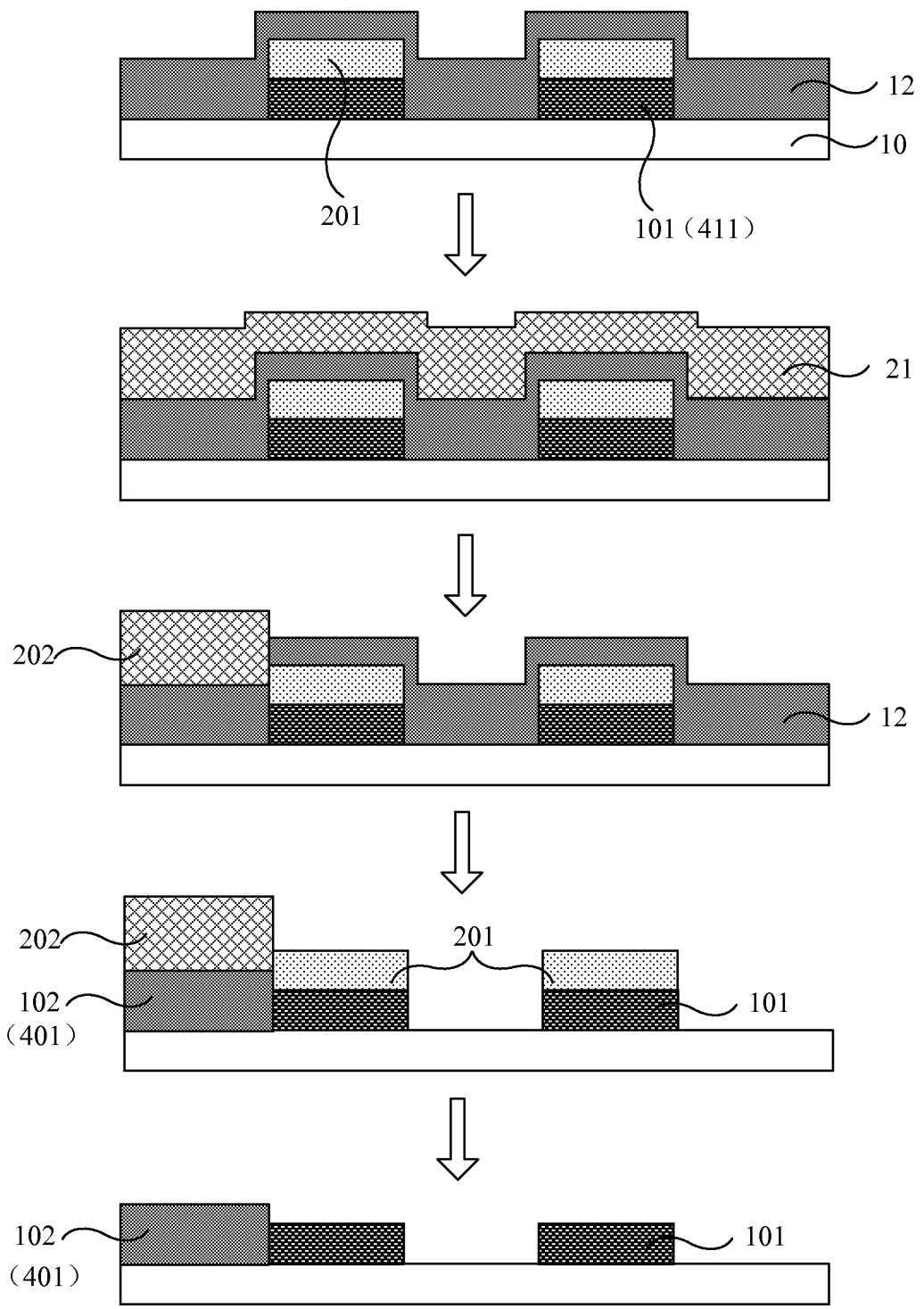
FIG. 4 is a schematic structural view illustrating another process for forming the thin-film layer patterns provided by the embodiment of the present invention.

S201: as illustrated in FIG. 4, forming a second thin-film layer 12 to be patterned. For instance, the second thin-film layer 12 to be pattered may be formed by deposition, sputtering, coating, printing or the like.

S202: forming a second overcoat layer 21 on a surface of the second thin-film layer 12.

S203: forming a second overcoat layer pattern 202 by beam melting.

S204: removing the second thin-film layer 12 not covered by the second overcoat layer pattern 202 to form a second thin-film layer pattern 102.

S205: removing the first overcoat layer pattern 201 and the second overcoat layer pattern 202 to form the substrate provided with the first thin-film layer pattern 101 and the second thin-film layer pattern 102 at the same time.

In this case, after the process of forming the first thin-film layer pattern 101 and the second thin-film layer pattern 102, the first overcoat layer pattern 201 disposed on surfaces of the first thin-film layer pattern 101 and the second overcoat layer pattern 202 disposed on surfaces of the second thin-film layer pattern 102 are removed at the same time (e.g., by wet etching process). Therefore, the manufacturing process can be simplified and the production efficiency can be improved. Moreover, before the process of forming the second thin-film layer pattern 102, the first overcoat layer pattern 201 disposed on the surfaces of the first thin-film layer pattern 101 are retained and can protect the first thin-film layer pattern 101 formed on the surface of the substrate 10 in the subsequent processes, so that the first thin-film layer pattern 101 cannot be damaged in the process of manufacturing the second thin-film layer pattern 102.

In one embodiment of the present invention, the materials of the first thin-film layer 11 or the second thin-film layer 12 may include any one or more selected from conducting materials, insulating materials and semiconductor materials. The conducting materials include metal, alloy, metal oxide, etc., e.g., chromium, titanium, aluminum, molybdenum, nickel and other metals or alloys and indium tin oxide (ITO). The insulating materials include nitride, oxynitride, insulating resin material, etc., e.g., silicon nitride and silicon oxide. The semiconductor materials include amorphous silicon (a-Si), polycrystalline silicon (p-Si), metal oxide, etc., e.g., indium gallium zinc oxide (IGZO).

Figure 5:
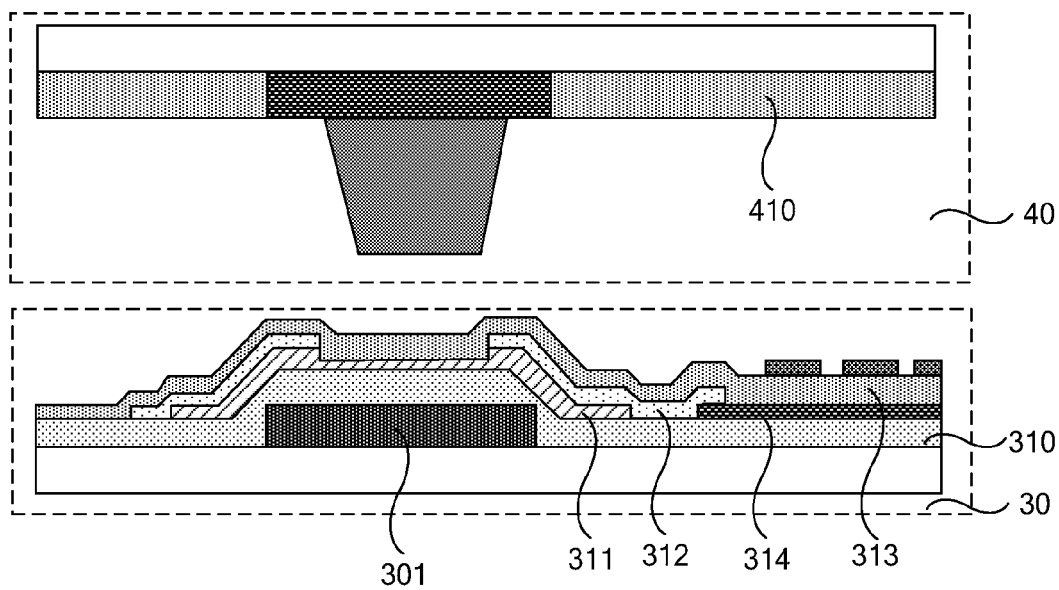
FIG. 5 is a schematic structural view of a display substrate provided by an embodiment of the present invention.

For instance, as illustrated in FIG. 5, the first thin-film layer or the second thin-film layer may be made each from a conducting material, e.g., may be a gate layer 301 of a thin-film transistor (TFT) disposed on an array substrate 30; or the first thin-film layer or the second thin-film layer may be made each from an insulating material, e.g., may be a gate insulating layer 310 disposed on the array substrate 30 or a CF layer 410 disposed on a CF substrate 40; or the first thin-film layer or the second thin-film layer may include one or more thin-film layers selected from the gate layer 301 of the TFT made from a conducting material and disposed on the array substrate 30, the gate insulating layer 310 and a passivation layer 313 made from an insulating material, an active layer 311 made from a semiconductor material, a source/drain metal layer 312 made from a conducting material and a pixel electrode layer 314 made from a conducting material.

Description is given above only by taking the material and the thin-film layer pattern of the first thin-film layer 11 or the second thin-film layer 12 as an example. Other kinds of first thin-film layers 11 or second thin-film layers 12 are not illustrated herein one by one but shall all fall within the scope of protection of the present invention.

In this case, the thin-film layer pattern of each layer on the array substrate 30 or the CF substrate 40 may be formed by the beam melting of a thin film through, for instance, high-energy beams, or another thin-film layer pattern is formed by the beam melting of a thin film on the basis of part of a formed thin-film layer pattern. Therefore, more manufacturing and processing methods can be provided for those skilled in the art, so that the method for forming the thin-film layer pattern can be flexibly selected by those skilled in the art according to actual manufacturing and processing requirements.

In addition, as for different substrates, for instance, the thickness of each thin-film layer of the array substrate 30 or the CF substrate 40 is different. In the manufacturing process, for instance, the thickness of the first overcoat layer 20 or the second overcoat layer 21 may be 2,000 to 5,000 Å. When the thickness of the first overcoat layer 20 or the second overcoat layer 21 is too small, e.g., less than 2,000 Å, as the thickness of the above overcoat layer is too small, the control difficulty of the beam melting process is increased. For instance, in the process of forming the first overcoat layer pattern 201 by the beam melting of the first overcoat layer 20, if the thickness of the first overcoat layer 20 is too small, the first overcoat layer 20 may have been completely melt when the first overcoat layer pattern 201 are not formed. In this case, the surface of the first thin-film layer 11 covered by the first overcoat layer 20 will be damaged. If the thickness of the first overcoat layer 20 or the second overcoat layer 21 is more than 5,000 Å, as the thickness of the above overcoat layer is too large, the time of the beam melting process will be increased, and hence the power consumption can be increased and energy waste can be caused. Therefore, the range of the thickness of the first overcoat layer 20 or the second overcoat layer 21 may be 2,000 to 5,000 Å.

In addition, the thickness of the first thin-film layer 11 or the second thin-film layer 12 may be 200 to 30,000 Å. The first thin-film layer 11 or the second thin-film layer 12 may be used for forming some thin-film layer patterns on the display substrate, e.g., the array substrate 30 or the CF substrate 40. For instance, the first thin-film layer or the second thin-film layer may be used for forming the gate layer 301 of the TFT disposed on the array substrate 30. Therefore, when the thickness of the first thin-film layer 11 or the second thin-film layer 12 is too small, e.g., less than 200 Å, the formed thin-film layer pattern, e.g., the gate layer 301 of the TFT, tends to cause disconnection in the subsequent manufacturing and processing process, and hence the quality of the TFT can be influenced. However, when the thickness of the first thin-film layer 11 or the second thin-film layer 12 is too large, e.g., more than 30,000 Å, the thickness of the formed thin-film layer pattern, e.g., the CF layer, will be increased, and hence the manufacturing cost can be increased, which is not helpful to the ultra-thin design trend of the display substrate. Thus, the thickness of the first thin-film layer 11 or the second thin-film layer 12 may be 200 to 30,000 Å.

It should be noted that: in the process of manufacturing the substrate provided with a plurality of film layers, the first thin-film layer 11 and the second thin-film layer 12 are only a relative concept and is not limited to the thin-film layer of a specific material.

Figure 6:
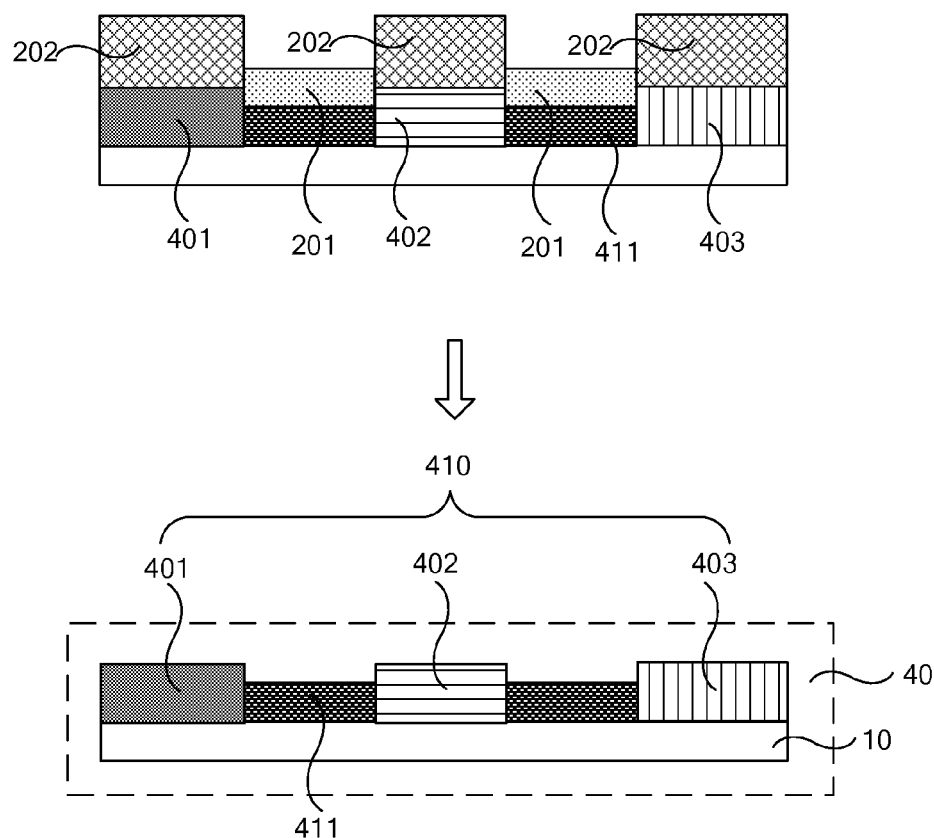
FIG. 6 is a schematic structural view illustrating one process for manufacturing the display substrate provided by the embodiment of the present invention.

In at least one embodiment of the present invention, for instance, when the CF substrate 40 as shown in FIG. 6 is manufactured, a film layer for forming the black matrix layer 411 may be taken as the first thin-film layer; the first thin-film layer is formed on the surface of the substrate; the black matrix layer 411 is formed by the steps S101 to S104; the second thin-film layer is formed on the surface of the substrate provided with the black matrix layer 411; and a red filter structure 401 is formed by the steps S201 to S204. When a green filter structure 402 is manufactured, the film layer for forming the black matrix layer 411 can also be taken as the first thin-film layer, and a film layer for forming the green filter structure 402 is taken as the second thin-film layer; and the green filter structure 402 is manufactured by the steps S201 to S204. Subsequently, when a blue filter structure 403 is manufactured, the film layer for forming the black matrix layer 411 can also be taken as the first thin-film layer, and a film layer for forming the blue filter structure 403 is taken as the second thin-film layer; and the blue filter structure 403 is manufactured by the steps S201 to S204. Finally, the first overcoat layer pattern 201 on surfaces of the black matrix layer 411, the second overcoat layer pattern 202 on a surface of the red filter structure 401, the second overcoat layer pattern 202 on a surface of the green filter structure 402, and the second overcoat layer pattern 202 on a surface of the blue filter structure 403 are removed by the step S205. Thus, the CF substrate 40 is manufactured.

Figure 7:
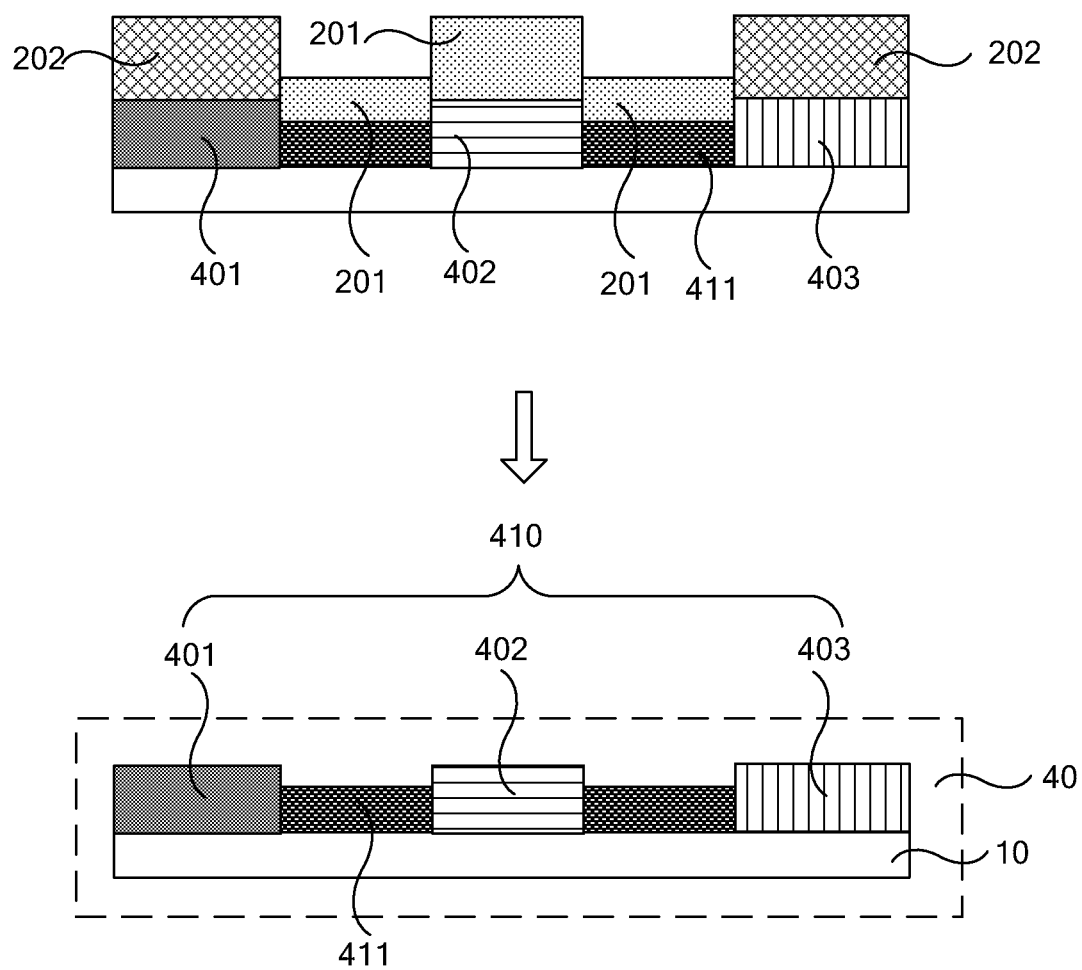
FIG. 7 is a schematic structural view illustrating another process for manufacturing the display substrate provided by the embodiment of the present invention.

Moreover, for instance, when the CF substrate 40 as shown in FIG. 7 is manufactured, the film layer for forming the black matrix layer 411 may be taken as the first thin-film layer; the first thin-film layer is formed on the surface of the substrate; the black matrix layer 411 is formed by the steps S101 to S104; subsequently, the second film layer is formed on the surface of the substrate provided with the black matrix layer 411; and a red filter structure 401 is formed by the steps S201 to S204. Subsequently, when a green filter structure 402 is manufactured, a film layer for forming the green filter structure 402 may be taken as the first thin-film layer, and the green filter structure 402 is formed by the steps S101 to S104. Subsequently, a film layer for forming a blue filter structure 403 may be taken as the second thin-film layer, and the blue filter structure 403 is formed by the steps S201 to S204. Finally, the first overcoat layer pattern 201 on the surfaces of the black matrix layer 411, the second overcoat layer pattern 202 on a surface of the red filter structure 401, the first overcoat layer pattern 201 on a surface of the green filter structure 402 and the second overcoat layer pattern 202 on a surface of the blue filter structure 403 may be removed by the step S205.

In at least one embodiment of the present invention, the process of removing the first thin-film layer not covered by the first overcoat layer pattern 201 or removing the second thin-film layer not covered by the second overcoat layer pattern 202 includes: removing the first thin-film layer not covered by the first overcoat layer pattern 201 or the second thin-film layer not covered by the second overcoat layer pattern 202 by, for instance, wet etching process or ashing process.

In at least one embodiment of the present invention, for instance, when the black matrix layer 411 of the CF substrate 40 is formed, the film layer for forming the black matrix layer 411 is taken as the first thin-film layer, and the removing process may be performed by wet etching process. The substrate in which the first overcoat layer pattern 201 cover the first thin-film layer is placed in, e.g., sodium hydroxide (NaOH) etching liquid. As the etching liquid cannot corrode the first overcoat layer pattern 201 made from, e.g., a metallic material, the first thin-film layer not covered by the first overcoat layer pattern 201 may be removed by the NaOH etching liquid. It should be noted that: when the wet etching process is adopted, the etching liquid cannot corrode the first overcoat layer pattern 201 or the second overcoat layer pattern 202 made from, e.g., a metallic material.

Or the first thin-film layer not covered by the first overcoat layer pattern 201 may also be removed by, e.g., ion bombardment through an ashing process.

In this case, the realizability of the above removing method can be improved. Moreover, the above removing method may be selected by those skilled in the art according to actual production requirements and the balance on the manufacturing cost and the difficulty of the manufacturing process.

In at least one embodiment of the present invention, the beam for achieving beam melting may include laser emitted by a solid laser, a gas laser, a liquid laser or a semiconductor laser and other beams capable of achieving beam melting. For instance, the solid laser may be a neodymium-doped yttrium aluminum garnet (Nd:YAG) laser (1,064 nm). The gas laser may be an excimer laser with the working substance of ArF (193 nm), KrF (248 nm), XeCl (308 nm) or XeCl (351 nm); a nitrogen laser (337 nm); an argon laser (488 nm, 514 nm); a helium-neon laser (632.8 nm); or a carbon dioxide laser (10,600 nm). The liquid laser may be a dye laser (400 to 700 nm). The wavelength of laser emitted by the semiconductor laser may be 390 to 1,550 nm.

The wavelength of the adopted laser is related to the material and the thickness of the first overcoat layer 20 or the second overcoat layer 21 subjected to melting and may be at a specific wavelength or in a wavelength range, for instance, may be 248 nm or 150-400 nm. The energy of the adopted laser is related to the material and the thickness of the first overcoat layer 20 or the second overcoat layer 21 subjected to melting. When the thickness of the first overcoat layer 20 or the second overcoat layer 21 is larger, the energy required by the laser for achieving melting is larger. It should be noted that metal after melting will be sputtered to the air by the laser to form solid dust substances, and for instance, the solid dust substances may be absorbed by a dust collector. Therefore, after the melting of the first overcoat layer 20 or the second overcoat layer 21, the surface of the first thin-film layer 11 or the second thin-film layer 12 covered by the first overcoat layer 20 or the second overcoat layer 21 can be guaranteed to have specific surface finish. When another thin-film layer is formed on the surface of the substrate provided with the above structures, the surface of other thin-film layer can also be planarized.

In at least one embodiment of the present invention, the above laser beams may be made into beams in a pattern to perform melting on part of the first overcoat layer 20 and part of the second overcoat layer 21 so as to form the first overcoat layer pattern 201 and the second overcoat layer pattern 202. As the method for performing laser melting on the thin films can simplify the patterning production process, the complex manufacturing processes such as exposure and development are not required. As the accuracy of the laser can be in nanometer, the accuracy of the thin-film layer patterns can be improved, and hence the resolution of the display substrate can be improved. In addition, the first thin-film layer 11 or the second thin-film layer 12 disposed between the first overcoat layer 20 or the second overcoat layer 21 and the substrate 10 is baked by the thermal effect produced in the process of performing melting on the first overcoat layer 20 or the second overcoat layer 21 via the laser beams. Thus, the first thin-film layer 11 or the second thin-film layer 12 can be more uniform and more stable, and hence the product quality can be improved.

In at least one embodiment of the present invention, when the substrate 10 is a conventional glass substrate, for instance, the material of the first overcoat layer 20 or the second overcoat layer 21 may include a metallic material with a melting point of 50-300. For instance, the some low-melting metal may be adopted, e.g., at least one selected from metal such as Tin (Sn, with a melting point of 232.06) and indium (In, with a melting point of 232.06) or alloys of several metals. In this case, as the melting point of the conventional glass substrate is generally 500, when the beam is adopted to perform melting on the first overcoat layer 20 or the second overcoat layer 21 made from the metallic material with a melting point of 50 to 300, in one aspect, the conventional glass substrate will not have undesirable phenomenon such as deformation. In another aspect, the first overcoat layer pattern 201 or the second overcoat layer pattern 202 can be formed in the melting process without high temperature, and hence the energy consumption can be saved. Moreover, the first thin-film layer 11 or the second thin-film layer 12 disposed between the first overcoat layer 20 or the second overcoat layer 21 and the substrate 10 will not be damaged by the thermal effect produced in the melting process. It should be noted that: as the metallic material with a melting point of less than 50 have high chemical activity, the difficulty of the melting process can be increased in the process of performing laser melting on the metallic material. Therefore, in at least one embodiment of the present invention, the low-melting metals include metallic material with a melting point of not less than 50.

In addition, when the substrate 10 adopts quartz glass, as the melting point of the quartz glass is 1,200, the metallic material for forming the first overcoat layer 20 or the second overcoat layer 21 may correspondingly adopt some metals with a high melting point. However, when a metal with a high melting point are subjected to melting, the energy consumption of the laser is large. Thus, the material of the first overcoat layer 20 or the second overcoat layer 21 may include a low-melting metal.

At least one embodiment of the present invention provides a method for manufacturing a display substrate, which comprises: forming a first thin-film layer to be patterned on a substrate; forming a first overcoat layer on a surface of the first thin-film layer; forming a first overcoat layer pattern by beam melting; and removing the first thin-film layer not covered by the first overcoat layer pattern to form a first thin-film layer pattern.

In the method for manufacturing the display substrate, provided by at least one embodiment of the present invention, after the step of removing the first thin-film layer not covered by the first overcoat layer pattern to form a first thin-film layer pattern, the method further comprises: removing the first overcoat layer pattern.

In the method for manufacturing the display substrate, provided by at least one embodiment of the present invention, after the step of removing the first thin-film layer not covered by the first overcoat layer pattern to form a first thin-film layer pattern, the method further comprises: forming a second thin-film layer to be patterned; forming a second overcoat layer on a surface of the second thin-film layer; forming a second overcoat layer pattern by beam melting; removing the second thin-film layer not covered by the second overcoat layer pattern to form a second thin-film layer pattern; and removing the first overcoat layer pattern and the second overcoat layer pattern.

Figure 8:
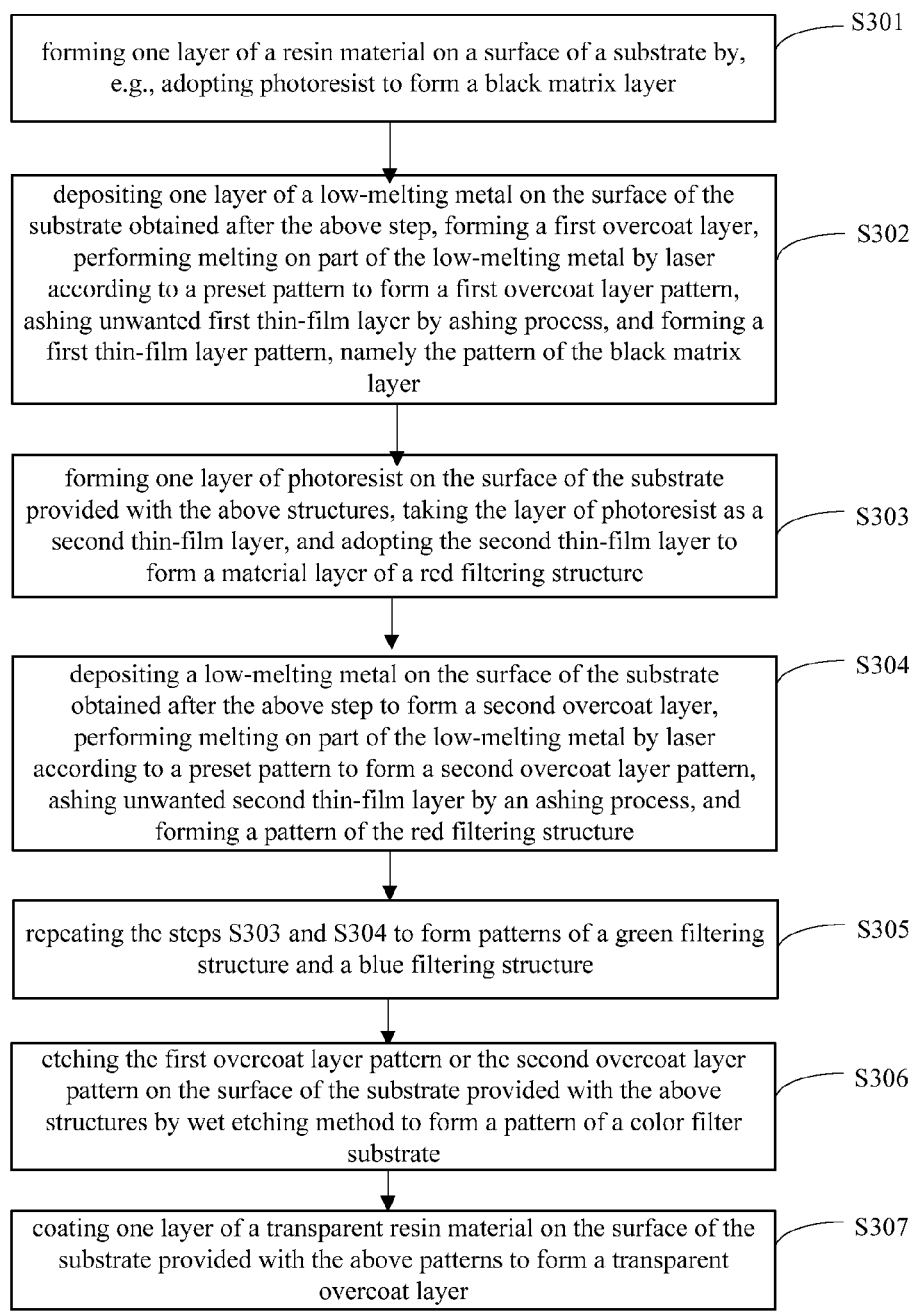
FIG. 8 is a flowchart of a method for manufacturing a display substrate provided by an embodiment of the present invention.

The method for manufacturing the display substrate, provided by at least one embodiment of the present invention, further comprises: forming a transparent overcoat layer on the surface of the substrate. The process for manufacturing the display substrate (e.g., the CF substrate), provided by the embodiment of the present invention, is illustrated below as shown in FIG. 8.

S301: forming one layer of a resin material on a surface of a substrate 10 as shown in FIG. 2 by, e.g., coating, printing or the like, taking the layer of the resin material as a first thin-film layer 11, and for instance, adopting photoresist (PR) to form a black matrix layer 411.

S302: depositing one layer of, e.g., a low-melting metal on the surface of the substrate obtained after the above step, forming a first overcoat layer 20, performing melting on part of the low-melting metal by, e.g., laser according to a preset pattern to form a first overcoat layer pattern 201, ashing unwanted first thin-film layer 11 by, e.g., ashing process, and forming a first thin-film layer pattern 101, namely a pattern of the black matrix layer 411.

S303: as illustrated in FIG. 4, forming one layer of PR (e.g., a red PR layer) on the surface of the substrate provided with the above structures, taking the layer of PR as a second thin-film layer 12, and adopting the second thin-film layer 12 to form a material layer of a red filter structure 401.

S304: depositing, e.g., low-melting metals on the surface of the substrate obtained after the above step to form a second overcoat layer 21, performing melting on partial low-melting metals by, e.g., laser according to a preset pattern to form a second overcoat layer pattern 202, ashing unwanted second thin-film layer 12 by ashing process, and forming a pattern of the red filter structure 401.

S305: repeating the steps S303 and S304 to form patterns of a green filter structure 402 and a blue filter structure 403 as shown in FIG. 6 or 7.

S306: etching the first overcoat layer pattern 201 or the second overcoat layer pattern 202 on the surface of the substrate provided with the above structures by, e.g., wet etching method to form a pattern of a CF substrate 40.

Figure 9:
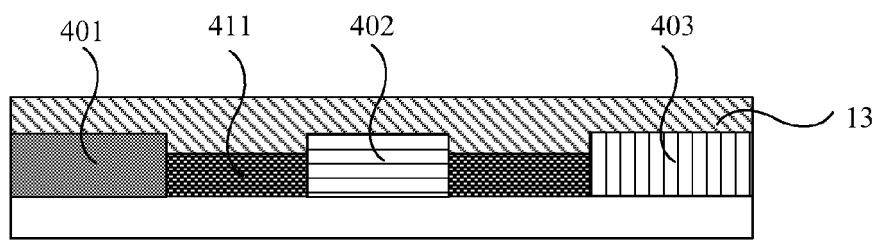
FIG. 9 is a schematic structural view of another display substrate provided by an embodiment of the present invention.

S307: as illustrated in FIG. 9, coating one layer of a transparent resin material on the surface of the substrate provided with the above pattern to form a transparent overcoat layer 13, and planarizing the pattern of the CF substrate 40.

In summary, in the process of manufacturing the CF substrate 40, the film layer patterns of the CF substrate 40 are formed by adoption of high-accuracy beams emitted by a laser to replace a mask. Compared to a mask with the accuracy in micrometer, the accuracy of the beam is in nanometer, and hence the accuracy of the thin-film layer patterns obtained by the beam melting method is also in nanometer. Thus, the method for performing melting on the low-melting metal layer by laser beams may be adopted to manufacture the display substrate, and hence the accuracy and the resolution of the display substrate can be improved. Therefore, the product quality can be improved and the manufacturing cost can be reduced.

The embodiment of the present invention provides a display substrate, which comprises a plurality of thin-film layer patterns. At least one thin-film layer pattern in the plurality of thin-film layer patterns is formed by any foregoing method for forming the thin-film layer pattern. As the method for forming the thin-film layer pattern has been described in detail in the above embodiments, no further description will be given here.

At least one embodiment of the present invention provides a display substrate, which comprises a first thin-film layer to be patterned formed on a substrate, a first overcoat layer formed on a surface of the first thin-film layer, and a first overcoat layer pattern formed by beam melting. In this case, during the manufacturing and processing of the display substrate, high-accuracy beams can be adopted to replace the mask. As the accuracy of the beams is in nanometer, the accuracy of the thin-film layer patterns obtained by the beam melting method is also in nanometer. Therefore, the accuracy and the resolution of the display substrate can be improved; the product quality can be improved; and the manufacturing cost can be reduced.

At least one embodiment of the present invention provides a display substrate, which further comprises: a first thin-film layer pattern disposed at areas not covered by the first overcoat layer pattern. The first thin-film layer pattern may be formed by removing the first thin-film layer not covered by the first overcoat layer pattern.

In at least one embodiment of the present invention, as illustrated in FIG. 5, the display substrate may be a CF substrate 40, and the first thin-film layer includes a CF layer 410 or black matrix layer 411; or the display substrate is an array substrate 30, and the first thin-film layer includes any one or more selected from a gate layer 301, a gate insulating layer 310, an active layer 311, a source/drain layer 312, a passivation layer 313 and a pixel electrode layer 314. In this case, the thin-film layer patterns of each layer on the display substrate such as the array substrate 30 or the CF substrate 40 may be formed by the beam melting of a thin film, or other thin-film layer pattern is formed by the beam melting of a thin film on the basis of part of formed thin-film layer pattern. Therefore, the method for forming the thin-film layer pattern can be flexibly selected by those skilled in the art according to actual manufacturing and processing requirements.

At least one embodiment of the present invention provides a display substrate, which comprises a plurality of thin-film layer patterns. At least one thin-film layer pattern in the plurality of thin-film layer patterns is formed by beam melting. As the accuracy of the beams is in nanometer, the accuracy of the thin-film layer patterns obtained by the beam melting method is also in nanometer. Therefore, the accuracy and the resolution of the display substrate can be improved; the product quality can be improved; and the manufacturing cost can be reduced.

The display substrate provided by the embodiment of the present invention may be a substrate applied in a display device, e.g., an array substrate or a CF substrate in an LCD panel, an array substrate in an organic light-emitting diode (OLED) display panel and an array substrate in an e-paper display.

Figure 10:
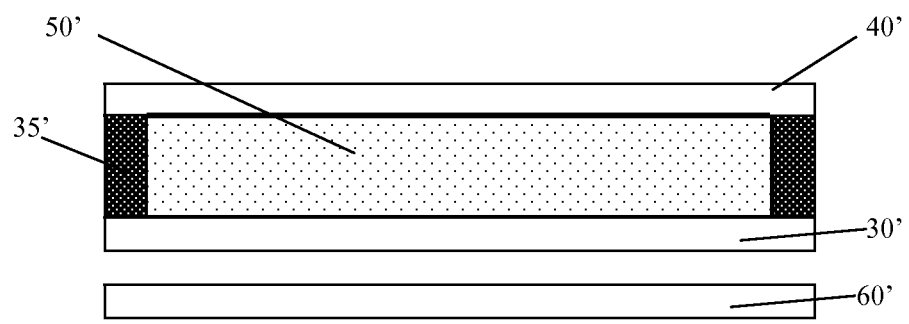
FIG. 10 is a schematic structural view of a display device provided by the embodiment of the present invention.

At least one embodiment of the present invention provides a display device, which comprises the foregoing display substrate. For instance, as illustrated in FIG. 10, the display device provided by the embodiment of the present invention may comprise an array substrate 30' and an opposing substrate 40'. The array substrate 30' and the opposing substrate 40' are arranged opposite to each other to form a liquid crystal cell via sealant 35', and liquid crystal material 50' are filled in the liquid crystal cell. The opposing substrate 40' is, for instance, a CF substrate. A pixel electrode of each pixel unit of the array substrate 30' is configured to apply an electric field to control the rotation degree of the liquid crystal material so as to perform display operations. In some embodiments, the display device further comprises a backlight 60' configured to provide backlight for the array substrate 30'. When the array substrate comprises filter structures, the opposing substrate does not need to include filter structures.

The display device may be: any product or component with display function such as an LCD panel, e-paper, an OLED panel, a mobile phone, a tablet PC, a TV set, a display, a notebook computer, a digital picture frame and a navigator.

The foregoing is only partial embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201410015561.9 submitted on Jan. 14, 2014. The disclosure content of the Chinese patent application is entirely incorporated by reference herein as part of the application.

The invention claimed is:
1. A method for manufacturing a thin-film layer pattern, comprising:
forming a first thin-film layer to be patterned on a substrate;
forming a first overcoat layer on a surface of the first thin-film layer;
forming a first overcoat layer pattern by beam melting; and
forming a first thin-film layer pattern by removing the first thin-film layer not covered by the first overcoat layer pattern,
wherein after the forming the first thin-film layer pattern, the method further comprises:
forming a second thin-film layer to be patterned;
forming a second overcoat layer on a surface of the second thin-film layer;

forming a second overcoat layer pattern by beam melting;

forming a second thin-film layer pattern by removing the second thin-film layer not covered by the second overcoat layer pattern; and after the forming the second thin-film layer pattern, removing residual first overcoat layer patterns and the second overcoat layer pattern together.

2. The method for forming the thin-film layer pattern according to claim 1, after the forming the first thin-film layer pattern, further comprising: removing the first overcoat layer pattern.

3. The method for forming the thin-film layer pattern according to claim 1, wherein the beam includes: laser emitted by a solid laser, a gas laser, a liquid laser or a semiconductor laser.

4. The method for forming the thin-film layer pattern according to claim 1, wherein a material of the first overcoat layer or the second overcoat layer includes a metallic material with a melting point of 50 to 300° C.

5. The method for forming the thin-film layer pattern according to claim 1, wherein a material of the first thin-film layer or the second thin-film layer includes any one or more selected from a conducting material, an insulating material and a semiconductor material.

6. The method for forming the thin-film layer pattern according to claim 1, wherein a thickness of the first overcoat layer or the second overcoat layer is 2,000 to 5,000 Å.

7. The method for forming the thin-film layer pattern according to claim 1, wherein a thickness of the first thin-film layer or the second thin-film layer is 200 to 30,000 Å.

8. The method for forming the thin-film layer pattern according to claim 1, wherein the first thin-film layer not covered by the first overcoat layer pattern or the second thin-film layer not covered by the second overcoat layer pattern is removed by a wet etching process or ashing process.

9. A method for manufacturing a display substrate, comprising:

forming a first thin-film layer to be patterned on a substrate;

forming a first overcoat layer on a surface of the first thin-film layer;

forming a first overcoat layer pattern by beam melting; and forming a first thin-film layer pattern by removing the first thin-film layer not covered by the first overcoat layer pattern, wherein after the forming the first thin-film layer pattern, the method further comprises:

forming a second thin-film layer to be patterned;

forming a second overcoat layer on a surface of the second thin-film layer;

forming a second overcoat layer pattern by beam melting;

forming a second thin-film layer pattern by removing the second thin-film layer not covered by the second overcoat layer pattern; and after the forming the second thin-film layer pattern, removing residual first overcoat layer patterns and the second overcoat layer pattern together.

10. The method for manufacturing the display substrate according to claim 9, further comprising:

after the forming the first thin-film layer pattern, removing the first overcoat layer pattern.

11. The method for manufacturing the display substrate according to claim 9, further comprising: forming a transparent overcoat layer on the surface of the substrate.

* * * * *